United States Patent
Kim et al.

(10) Patent No.: US 8,614,443 B2
(45) Date of Patent: Dec. 24, 2013

(54) DISPLAY APPARATUS AND METHOD OF MANUFACTURING THE SAME

(75) Inventors: Swae-Hyun Kim, Asan-si (KR); YeoGeon Yoon, Seoul (KR); Jae Hwa Park, Gumi-si (KR); Changil Tae, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 101 days.

(21) Appl. No.: 13/236,329

(22) Filed: Sep. 19, 2011

(65) Prior Publication Data
US 2012/0211751 A1 Aug. 23, 2012

(30) Foreign Application Priority Data
Feb. 17, 2011 (KR) .................... 10-2011-0014242

(51) Int. Cl.
H01L 29/12 (2006.01)
H01L 27/088 (2006.01)
H01L 29/10 (2006.01)

(52) U.S. Cl.
USPC ............... 257/43; 257/401; 257/59; 257/72; 438/104

(58) Field of Classification Search
USPC ........... 257/43, 401, 59, 72; 438/104; 345/92; 349/139–148
See application file for complete search history.

(56) References Cited

U.S. PATENT DOCUMENTS

| 4,678,282 A * | 7/1987 | Yaniv et al. ..................... 349/42 |
| 5,187,602 A * | 2/1993 | Ikeda et al. ..................... 349/39 |
| 5,416,340 A * | 5/1995 | Yoshida et al. ................. 257/59 |
| 6,278,504 B1 | 8/2001 | Sung |
| 6,746,959 B2 * | 6/2004 | Lyu ................................ 438/689 |
| 7,459,323 B2 * | 12/2008 | Park et al. ...................... 438/30 |
| 2001/0011728 A1 * | 8/2001 | Gu et al. ......................... 257/72 |
| 2007/0236640 A1 * | 10/2007 | Kimura ......................... 349/141 |
| 2010/0051935 A1 * | 3/2010 | Lee et al. ....................... 257/43 |
| 2011/0128275 A1 * | 6/2011 | Ueda et al. ................... 345/212 |

FOREIGN PATENT DOCUMENTS

| KR | 10-2006-0124135 | 12/2006 |
| KR | 10-0809750 | 3/2008 |
| KR | 10-0944808 | 2/2010 |
| KR | 10-2011-0123626 | 11/2011 |

OTHER PUBLICATIONS

English Abstract for Publication No. 10-2006-0124135.

(Continued)

*Primary Examiner* — Jenny L Wagner
*Assistant Examiner* — Abbigale Boyle
(74) *Attorney, Agent, or Firm* — F. Chau & Associates, LLC

(57) ABSTRACT

A display apparatus includes a substrate and a plurality of pixels disposed on the substrate. Each pixel includes a gate electrode disposed on the substrate, a gate dielectric layer disposed on the substrate and the gate electrode, an oxide semiconductor pattern disposed on the gate dielectric layer, a first insulating pattern disposed on the oxide semiconductor pattern that overlaps the gate electrode, a second insulating pattern disposed on the oxide semiconductor pattern and spaced apart from the first insulating pattern, source and drain electrodes spaced apart from each other on the oxide semiconductor pattern, a pixel electrode pattern disposed on the second insulating pattern to make contact with the source electrode, and a channel area defined where the oxide semiconductor pattern overlaps the gate electrode. A high carrier mobility channel is formed in the channel area when a turn-on voltage is applied to the gate electrode.

10 Claims, 13 Drawing Sheets

(56) References Cited

OTHER PUBLICATIONS

English Abstract for Publication No. 10-2009-0119446. (for 10-0944808).

English Abstract for Publication No. 10-2002-0076932 (for 10-0809750).

English Abstract for Publication No. 10-2011-0123626.

* cited by examiner

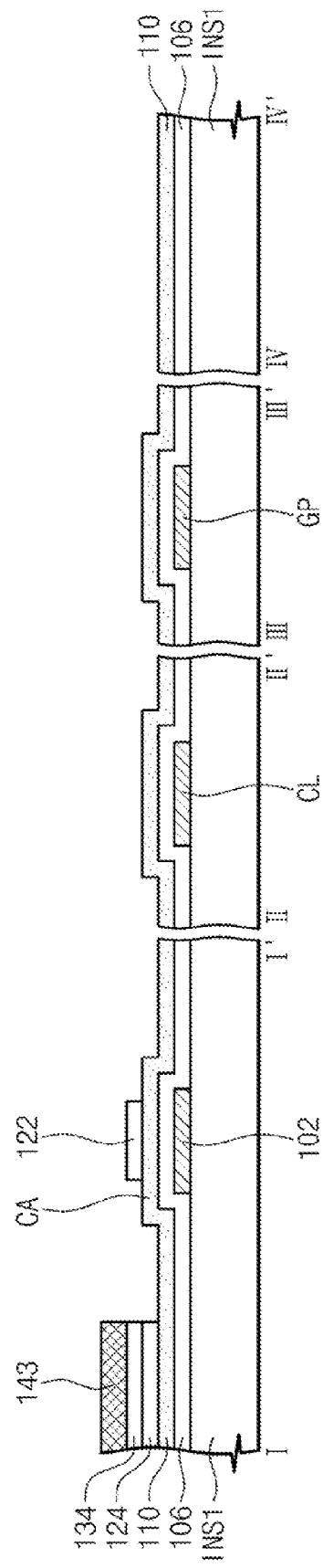

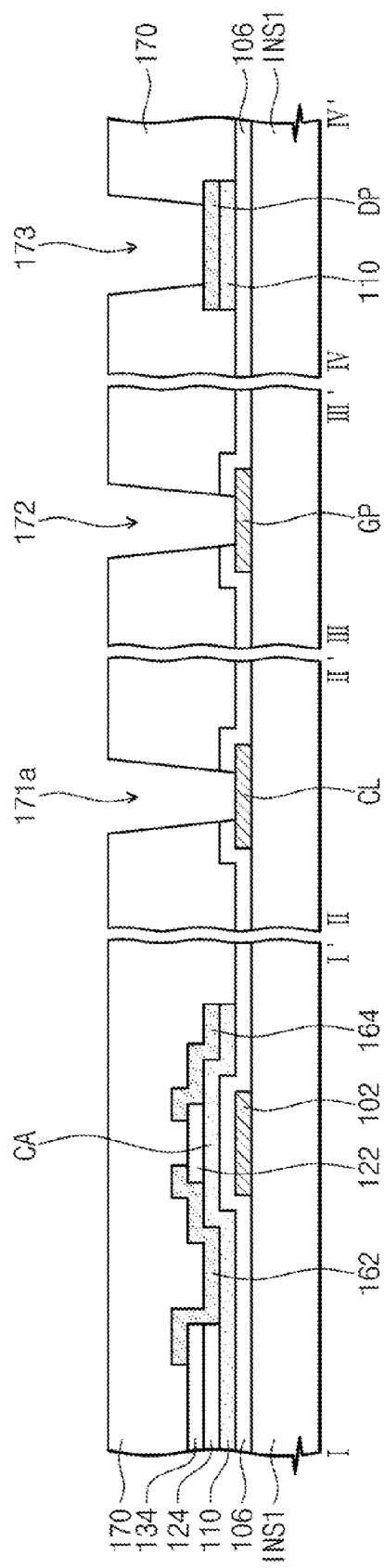

DISPLAY APPARATUS AND METHOD OF MANUFACTURING THE SAME

CROSS-REFERENCE TO RELATED APPLICATION

This application claims priority from Korean Patent Application No. 10-2011-0014242 filed on Feb. 17, 2011 in the Korean Intellectual Property Office (KIPO), the contents of which are herein incorporated by reference in their entirety.

BACKGROUND

1. Technical Field

The present disclosure is directed to a display apparatus and a method of manufacturing the display apparatus.

2. Description of the Related Art

A liquid crystal display is a thin display. A liquid crystal display may be classified as either an in-plane switching (IPS) mode liquid crystal display, a vertical alignment (VA) mode liquid crystal display, or a plane-to-line switching (PLS) mode liquid crystal display according to the driving mode for the liquid crystal layer.

A PLS mode liquid crystal display drives the liquid crystal layer using a horizontal and a vertical electric field to display an image. In a PLS mode liquid crystal display, liquid crystal molecules in the liquid crystal layer rotate substantially in parallel to a substrate of the liquid crystal display due to a strong fringe electric field.

SUMMARY

Exemplary embodiments of the present disclosure provide a display apparatus capable of reducing a manufacturing cost and simplifying a manufacturing process.

Exemplary embodiments of the present disclosure provide a method of manufacturing the display apparatus.

According to exemplary embodiments, a display apparatus includes a substrate and a plurality of pixels disposed on the substrate. Each pixel includes a gate electrode disposed on the substrate, a gate dielectric layer disposed on the substrate and the gate electrode, an oxide semiconductor pattern disposed on the gate dielectric layer that overlaps the gate electrode, a first insulating pattern disposed on the oxide semiconductor pattern that overlaps the gate electrode, a second insulating pattern disposed on the oxide semiconductor pattern and spaced apart from the first insulating pattern, a drain electrode disposed on the oxide semiconductor pattern, a source electrode disposed on the oxide semiconductor pattern spaced apart from the drain electrode, and a pixel electrode pattern disposed on the second insulating pattern that contacts the drain electrode.

The drain electrode covers a portion of the pixel electrode pattern.

Each pixel includes further includes a common electrode disposed over the pixel electrode pattern for forming an electric field with the pixel electrode pattern, where the common electrode includes a body portion and a plurality of branch portions branched from the body portion.

According to exemplary embodiments, a method of manufacturing a display apparatus is provided as follows. A gate electrode is formed on a substrate, and a dielectric layer, an oxide semiconductor layer, an insulating layer, and a pixel electrode layer on the substrate are sequentially formed. The pixel electrode layer and the insulating layer are patterned to form a first insulating pattern that overlaps the gate electrode, a second insulating pattern spaced apart from the first insulating pattern, and a pixel electrode pattern disposed on the second insulating pattern are formed. Then, a source electrode and a drain electrode spaced apart from each other are formed on the oxide semiconductor layer. A common electrode is formed on the pixel electrode pattern.

The patterning of the pixel electrode and insulating layers includes forming a dummy electrode pattern on the first insulating pattern.

A first mask pattern is further formed on the pixel electrode layer to overlap the gate electrode and a second mask pattern thicker than the first mask pattern is further formed on the pixel electrode layer to overlap the gate electrode. The pixel electrode layer and the insulating layer are patterned using the first and second mask patterns as an etching mask.

A portion of the second mask pattern is removed to form a third mask pattern thinner than the second mask pattern, the first mask pattern is removed, and the dummy electrode pattern is removed using the third mask pattern as an etching mask.

The patterning of the pixel electrode and insulating layers includes exposing first and second portions of the oxide semiconductor layer respectively corresponding to areas on either side of the gate electrode.

According to exemplary embodiments, a display apparatus includes a substrate and a plurality of pixels disposed on the substrate. Each pixel includes a gate electrode disposed on the substrate, a gate dielectric layer disposed on the substrate and the gate electrode, an oxide semiconductor pattern disposed on the gate dielectric layer that overlaps the gate electrode, a first insulating pattern disposed on the oxide semiconductor pattern that overlaps the gate electrode, a second insulating pattern disposed on the oxide semiconductor pattern and spaced apart from the first insulating pattern, a drain electrode disposed on the oxide semiconductor pattern, a source electrode disposed on the oxide semiconductor pattern spaced apart from the drain electrode, a pixel electrode pattern disposed on the second insulating pattern that contacts the drain electrode, and a common electrode disposed over the pixel electrode pattern for forming an electric field with the pixel electrode pattern.

A channel area is defined where the oxide semiconductor pattern overlaps the gate electrode, wherein a channel is formed in the channel area when a turn-on voltage is applied to the gate electrode, the channel having a higher carrier mobility than a channel formed in a silicon layer.

The drain electrode covers a portion of the pixel electrode pattern and the oxide semiconductor pattern between the first and second insulating patterns, the second insulating pattern is spaced apart from the gate electrode, and a sidewall of the second insulating pattern is aligned and coplanar with a sidewall of the pixel electrode pattern.

According to the above, the PLS mode display apparatus employs the oxide semiconductor pattern of which the mobility of the carriers is high as the channel of the thin film transistor. The display apparatus is manufactured by the first to fifth photolithography processes. Thus, the number of process times applied to manufacture the display apparatus may be reduced. As a result, the manufacturing cost of the PLS mode display apparatus may be reduced and the manufacturing process of the PLS mode display apparatus may be simplified.

BRIEF DESCRIPTION OF THE DRAWINGS

FIGS. 3B, 4B, 5B, 6B, and 7B are cross-sectional views respectively taken along lines I-I', II-II', III-III', and IV-IV' respectively shown in FIGS. 3A, 4A, 5A, 6A, and 7A.

DETAILED DESCRIPTION

Embodiments of the present invention will become readily apparent by reference to the following detailed description with reference to the accompanying drawings. It will be understood that when an element or layer is referred to as being "on", "connected to" or "coupled to" another element or layer, it can be directly on, connected or coupled to the other element or layer or intervening elements or layers may be present. Like numbers refer to like elements throughout.

Hereinafter, exemplary embodiments of the present disclosure will be explained in detail with reference to the accompanying drawings.

Figure 1:
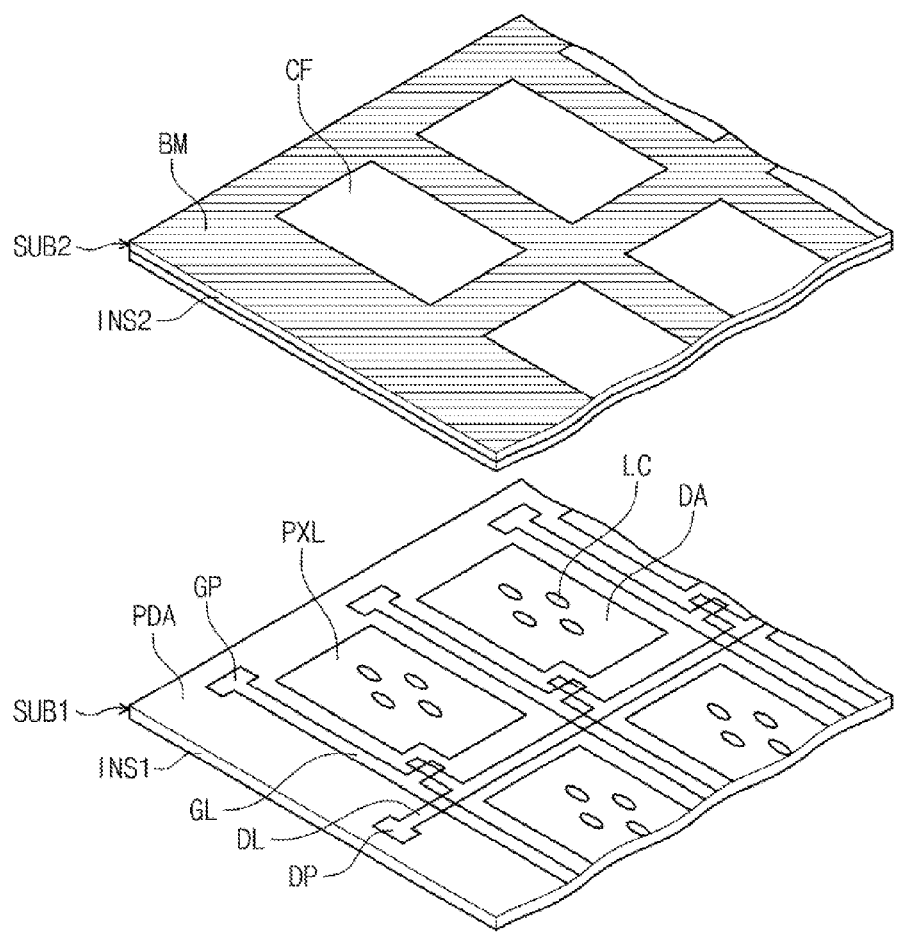
FIG. 1 is an exploded perspective view showing a display apparatus according to an exemplary embodiment of the present disclosure.
Figure 2A:
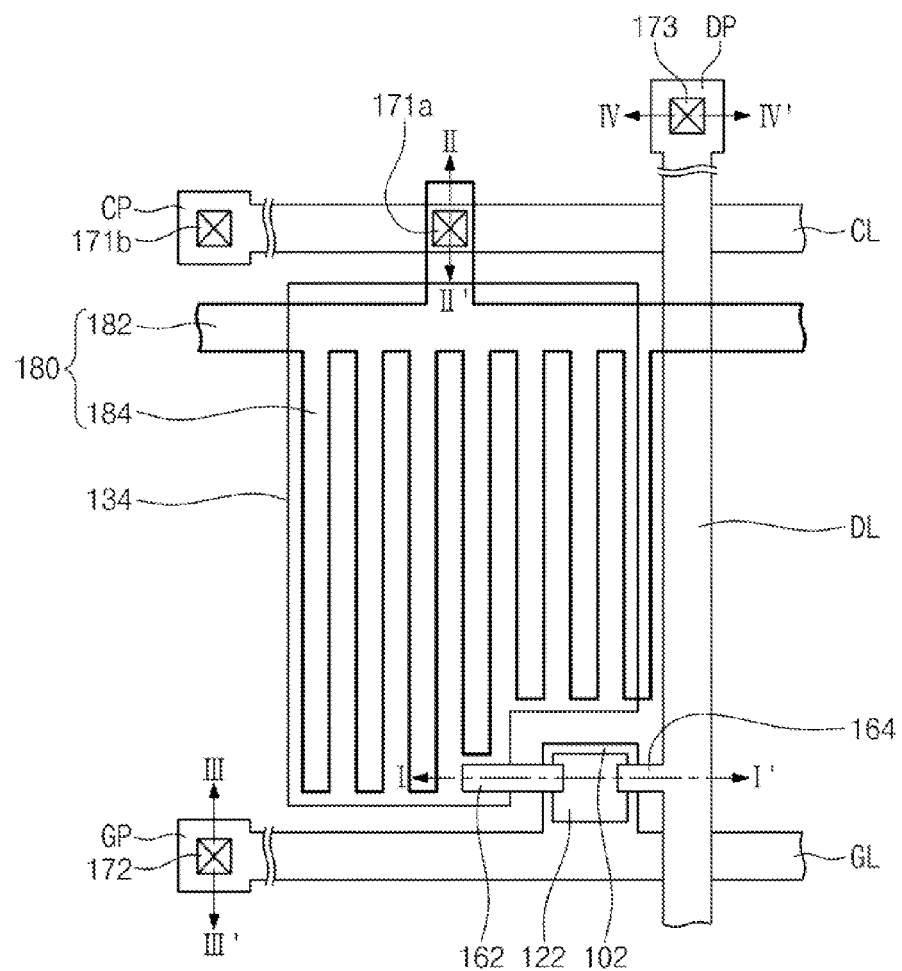
FIG. 2A is a plan view showing a part of a first substrate of the display apparatus shown in FIG. 1.
Figure 2B:
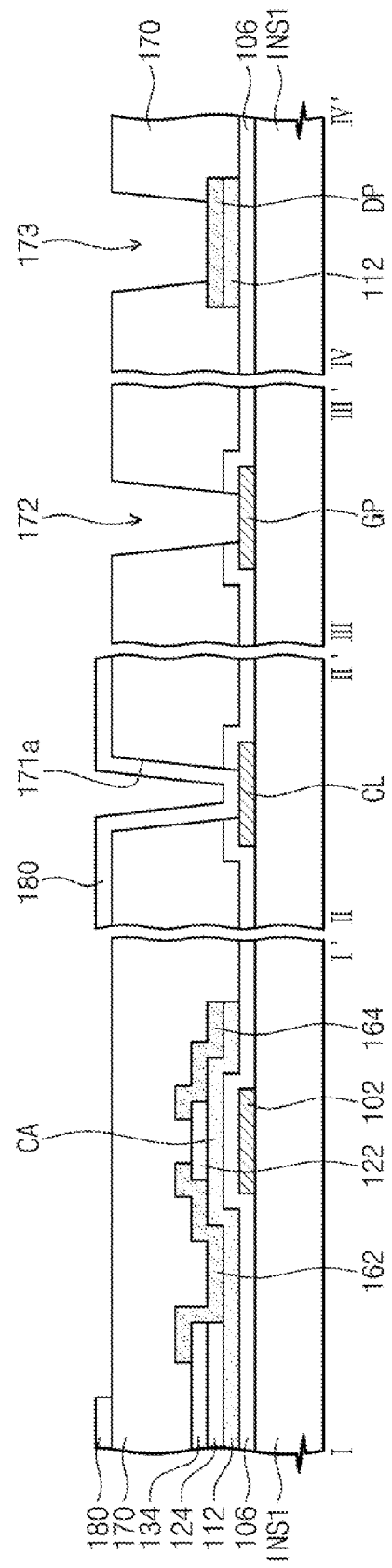
FIG. 2B is a cross-sectional view taken along lines I-I', II-II', III-III', and IV-IV' shown in FIG. 2A.

FIG. 1 is an exploded perspective view showing a display apparatus according to an exemplary embodiment of the present disclosure, FIG. 2A is a plan view showing a part of a first substrate of the display apparatus shown in FIG. 1, and FIG. 2B is a cross-sectional view taken along lines I-I', II-II', III-III', and IV-IV' shown in FIG. 2A.

Referring to FIGS. 1, 2A, and 2B, a display apparatus includes a first substrate SUB1, a second substrate SUB2 facing the first substrate SUB1, and a liquid crystal layer LC disposed between the first and second substrates SUB1 and SUB2.

The first substrate SUB1 includes a first insulating substrate INS1, a plurality of gate lines GL disposed on the first insulating substrate INS1 extending in a first direction, and a plurality of data lines DL disposed on the first insulating substrate INS1 extending in a second direction crossing the first direction.

The first insulating substrate INS1 includes a display area DA and a pad area PDA. The gate lines GL and the data lines DL are arranged in the display area DA.

Pixels PXL are respectively provided in pixel areas that are defined on the display area DA by the gate lines GL and the data lines DL. In a present exemplary embodiment, each pixel PXL has the same structure and function, and thus one pixel PXL will be described as a representative example. Each of the pixels PXL includes a thin film transistor and a pixel electrode pattern 134 connected to the thin film transistor. The thin film transistor includes a gate electrode 102, an oxide semiconductor pattern 112, a drain electrode 162, and a source electrode 164. The pixel electrode pattern 134 receives a pixel voltage from a corresponding data line of the data lines DL through the thin film transistor.

The gate electrode 102 branches from the gate line GL. According to a present exemplary embodiment, the gate electrode 102 may be protruded from the gate line GL to extend in the second direction. The gate electrode 102 may include at least one of copper, molybdenum, aluminum, tungsten, chromium, and titanium.

A gate dielectric layer 106 may be disposed on the gate electrode 102. The gate dielectric layer 106 is provided over the entire surface of the first insulating substrate INS1 to cover the gate line GL and the gate electrode 102. The gate dielectric layer 106 includes an insulating material. For example, the gate dielectric layer 106 may include at least one of an oxide silicon layer, a silicon oxide-nitride layer, and silicon nitride layer.

The oxide semiconductor pattern 112 is disposed on the gate dielectric layer 106. The oxide semiconductor pattern 112 is disposed on the gate electrode 102 while interposing the gate dielectric layer 106 therebetween. Thus, the oxide semiconductor pattern 112 overlaps the gate electrode 102 when viewed in a plan view.

The oxide semiconductor pattern 112 may include a semiconducting metal oxide material. For example, the oxide semiconductor pattern 112 may include at least one of zinc oxide, zinc tin oxide, zinc-indium oxide, zinc-gallium-oxide, and zinc-indium-gallium-oxide.

A channel area CA is defined where the oxide semiconductor pattern 112 overlaps the gate electrode 102. When a turn-on voltage is applied to the gate electrode 102, a channel is formed in the channel area. A mobility of carriers moving through the channel of the channel area CA of the oxide semiconductor pattern 112 may be higher than that of carriers moving through a channel formed in a silicon layer, thereby improving the conducting properties of the thin film transistor.

A first insulating pattern 122 and a second insulating pattern 124 are disposed on the oxide semiconductor pattern 112. The first insulating pattern 122 is disposed on the portion of the oxide semiconductor pattern 112 that overlaps the gate electrode 102. The second insulating pattern 124 is spaced apart from the first insulating pattern 122. When viewed in a plan view, the second insulating pattern 124 may be spaced apart from the gate electrode 102.

The first insulating pattern 122 and the second insulating pattern 124 may include the same material. For example, the first insulating pattern 122 and the second insulating pattern 124 may include a silicon oxide layer, a silicon nitride layer, or a silicon oxide-nitride layer. The first and second insulating patterns 122 and 124 may be formed of a material different from that of the gate dielectric layer 106. For example, when the gate dielectric layer 106 is formed of a silicon nitride layer, the first and second insulating patterns 122 and 124 may be formed of a silicon oxide layer.

The pixel electrode pattern 134 is disposed on the second insulating pattern 124. The pixel electrode pattern 134 may have a same area as that of the second insulating pattern 124 in a plan view. According to a present exemplary embodiment, the pixel electrode pattern 134 and the second insulating pattern 124 may be patterned using the same mask. Accordingly, a sidewall of the pixel electrode pattern 134 may be aligned with a sidewall of the second insulating pattern 124, so the sidewall of the pixel electrode pattern 134 may be coplanar with the sidewall of the second insulating pattern 124.

The pixel electrode pattern 134 may be formed of a transparent conductive material. For example, the pixel electrode pattern 134 may include indium tin oxide (ITO), indium zinc oxide (IZO), or indium tin zinc oxide (ITZO).

The drain electrode 162 and the source electrode 164 respectively cover a first portion and a second portion of the oxide semiconductor pattern 112, positioned on both sides of the gate electrode 102. The first portion of the oxide semiconductor pattern 112 is disposed between the first insulating pattern 122 and the second insulating pattern 124 adjacent to one side of the gate electrode 102. The second portion of the oxide semiconductor pattern 112 is adjacent to the other side of the gate electrode 102.

A first end portion of the drain electrode 162 is disposed on the first insulating pattern 122 and a second end portion of the drain electrode 162 is disposed on the pixel electrode pattern 134. A center portion of the drain electrode 162 between the first and second end portions contacts the first portion of the oxide semiconductor pattern 112.

A first end portion of the source electrode 164 is disposed on the first insulating pattern 122 spaced apart from the first end portion of the drain electrode 162. A sidewall of a second end portion of the source electrode 164 may be adjacent to and coplanar with the sidewall of the oxide semiconductor pattern 112. The source electrode 164 branches from the data line DL. In detail, the source electrode 164 may be protruded from the data line DL to extend in the first direction.

An interlayer dielectric layer 170 is disposed on the drain electrode 162, the source electrode 164, and the pixel electrode pattern 134. The interlayer dielectric layer 170 may include an insulating material. In addition, the interlayer dielectric layer 170 may be formed of a material different from that of the first and second insulating patterns 122 and 124. For example, when the first and second insulating patterns 122 and 124 are formed of a silicon oxide layer, the interlayer dielectric layer 170 may be formed of a silicon nitride layer.

A plurality of common voltage lines CL are disposed on the first insulating substrate INS1. The common voltage line CL transmits a common voltage. The common voltage line CL is partially covered by the gate dielectric layer 106 and the interlayer dielectric layer 170. The interlayer dielectric layer 170 is provided with a first common contact hole 171a formed therethrough to expose an upper surface of a portion of the common voltage line CL.

A common electrode 180 is disposed on the first insulating substrate INS1. The common electrode 180 is disposed on the interlayer dielectric layer 170. The common electrode 180 contacts the exposed portion of the common voltage line CL in the first common contact hole 171a. Thus, the common electrode 180 may be applied with the common voltage. When viewed in a plan view, the common electrode 180 overlaps the pixel electrode pattern 134. Due to a voltage difference between the common voltage and the pixel voltage of the pixel electrode pattern 134, an electric field is formed between the common electrode 180 and the pixel electrode pattern 134, thereby driving the liquid crystal molecules in the liquid crystal layer LC. The common electrode 180 includes a transparent conductive material. That is, the common electrode 180 may include the same material as the pixel electrode pattern 134.

The common electrode 180 includes a body portion 182 and a plurality of branch portions 184. According to a present exemplary embodiment, the body portion 182 extends in a predetermined direction and the branch portions 184 branch from the body portion 182 to extend in a direction substantially perpendicular to the predetermined direction and substantially parallel to each other. According to another exemplary embodiment, each of the branch portions 184 branched from the body portion 182 may extend in a different direction. The body portion 182 and the branch portions 184 may have various shapes.

In the pad area PDA, a gate pad part GP corresponding to an end of the gate line GL, a data pad part DP corresponding to an end of the data line DL, and a common voltage pad part CP corresponding to an end of the common voltage line CL are arranged. The gate pad part GP and the data pad part DP are connected to external lines through which signals for the pixels PXL are transmitted. The common voltage pad part CP is connected to other external lines through which the common voltage is transmitted.

The gate dielectric layer 106 and the interlayer dielectric layer 170, which partially cover the gate pad part GP, include a gate contact hole 172 through which an upper surface of the gate pad part GP is exposed. The gate pad part GP may be electrically connected to the external lines by conductive balls (not shown) disposed in the gate contact hole 172. The gate pad part GP may be formed from a same material and through the same process as the gate line GL.

The interlayer dielectric layer 170 partially covers the data pad part DP, and includes a data contact hole 173 to expose an upper surface of the data pad part DP. The data pad part DP may be electrically connected to the external lines by conductive balls (not shown) disposed in the data contact hole 173.

The data pad part DP is disposed on the oxide semiconductor pattern 112 and the gate dielectric layer 106. Both sidewalls of the data pad part DP may be coplanar with both sidewalls of the oxide semiconductor pattern 112 overlapped by the data pad part DP. The data pad part DP may be foamed of the same material and through the same process as the data line DL. Accordingly, the data line DL is disposed on the oxide semiconductor pattern 112 above the gate dielectric layer 106, and both sidewalls of the data line DL may be coplanar with both sidewalls of the oxide semiconductor pattern 112 overlapped by the data line DL.

The common voltage pad part CP may be formed of the same material and through the same process as the common voltage line CL. Thus, the gate dielectric layer 106 and the interlayer dielectric layer 170 are disposed on the common voltage pad part CP. The gate dielectric layer 106 and the interlayer dielectric layer 170, which partially cover the common voltage pad part CP, includes a second common contact hole 171b through which an upper surface of the common voltage pad part CP is exposed. The common voltage pad part CP may be electrically connected to the external lines by conductive balls (not shown) disposed in the second common contact hole 171b.

The second substrate SUB2 includes a second insulating substrate INS2, color filters CF disposed on the second insulating substrate INS2 to display red, green, and blue colors, and a black matrix BM formed between the color filters CF to block light passing through the liquid crystal layer LC.

At least one of the first substrate SUB1 and the second substrate SUB includes a spacer (not shown) formed thereon to maintain a distance, i.e., a cell gap, between the first and second substrates SUB1 and SUB2. The liquid crystal layer LC is disposed between the first substrate SUB1 and the second substrate SUB2, which are spaced apart from each other by a predetermined space by the spacer.

In the above-described display apparatus, the thin film transistor is turned on in response to a driving signal applied through the gate line GL. When the thin film transistor is turned on, an image signal provided through the data line DL is applied to the pixel electrode pattern 134 through the turned-on thin film transistor. Thus, an electric field is formed between the pixel electrode pattern 134 and the common electrode 180 that drives the liquid crystal molecules, to display an image.

Hereinafter, a method of manufacturing a display apparatus according to an embodiment of the present disclosure will be described.

FIGS. 3A, 4A, 5A, 6A, and 7A are plan views illustrating a method of manufacturing the first substrate SUB1 shown in FIGS. 1, 2A, and 2B, and FIGS. 3B, 4B, 5B, 6B, and 7B are cross-sectional views respectively taken along lines I-I', II-II', III-III', and IV-IV' respectively shown in FIGS. 3A, 4A, 5A, 6A, and 7A.

Figure 3A:
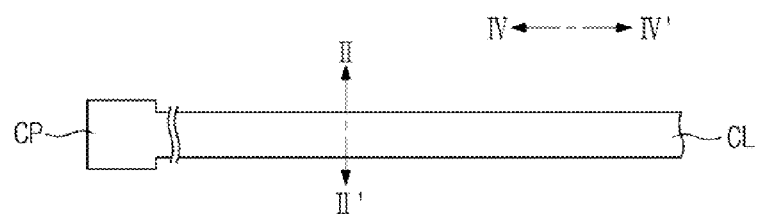
FIGS. 3A, 4A, 5A, 6A, and 7A are plan views illustrating a method of manufacturing the first substrate SUB1 shown in FIGS. 1, 2A, and 2B.
Figure 3A:
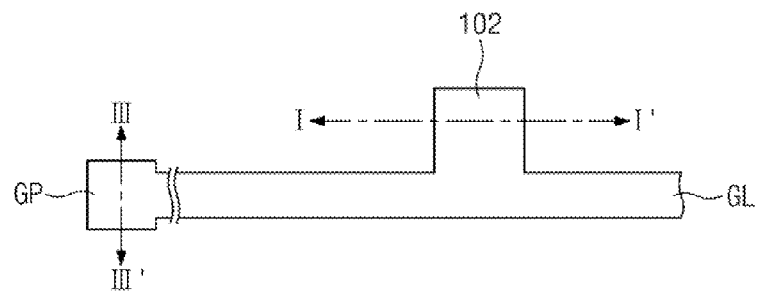
Figure 3B:
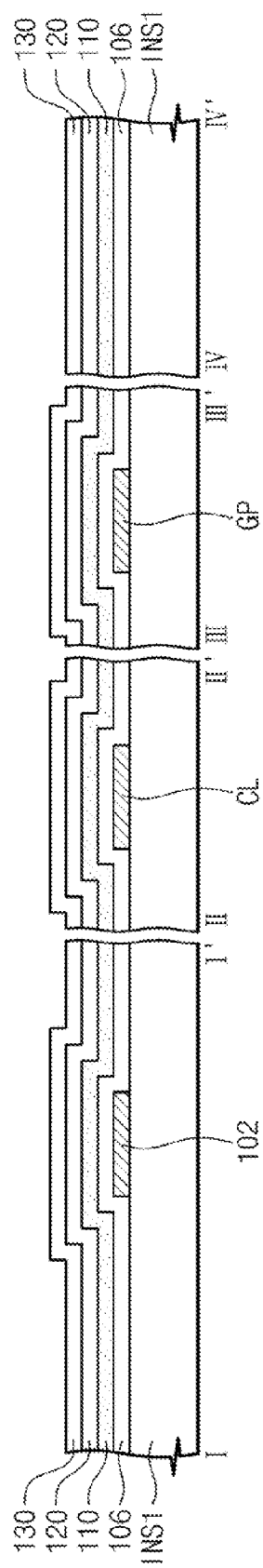

Referring to FIGS. 3A and 3B, a first photolithography process is performed to form the gate lines GL extending in the first direction, the gate pad parts GP, the common electrode lines CL, and the common electrode pad parts CP. The common electrode line CL may extend in the same direction parallel to the gate line. The gate line GL includes the gate electrode 102 branched from the gate line GL. The gate electrode 102 protrudes to extend in the second direction substantially perpendicular to the first direction.

The gate lines GL, the gate pad parts GP, the common electrode lines CL, and the common electrode pad parts CP are formed by forming a first conductive layer (not shown) on the first insulating substrate INS1 and patterning the first conductive layer. Therefore, the gate lines GL, the gate pad parts GP, the common electrode lines CL, and the common electrode pad parts CP may be formed of the same material.

The gate dielectric layer 106, an oxide semiconductor layer 110, an insulating layer 120, and a pixel electrode layer 130 are sequentially formed on the first insulating substrate INS1. The gate dielectric layer 106, the oxide semiconductor layer 110, the insulating layer 120, and the pixel electrode 130 cover the gate lines GL, the gate pad parts GP, the common electrode lines CL, and the common electrode pad parts CP.

The gate dielectric layer 106 is formed from an insulating material. The oxide semiconductor layer 110 is formed of a semi-conducting transparent metal oxide. The insulating layer 120 includes an insulating material. According to another exemplary embodiment, the insulating layer 120 may include a material different from that of the gate dielectric layer 106. For example, when the gate dielectric layer 106 is formed of a silicon nitride layer, the insulating layer 120 may be formed of a silicon oxide layer. The pixel electrode layer 130 is formed from a transparent conductive material.

Figure 4A:
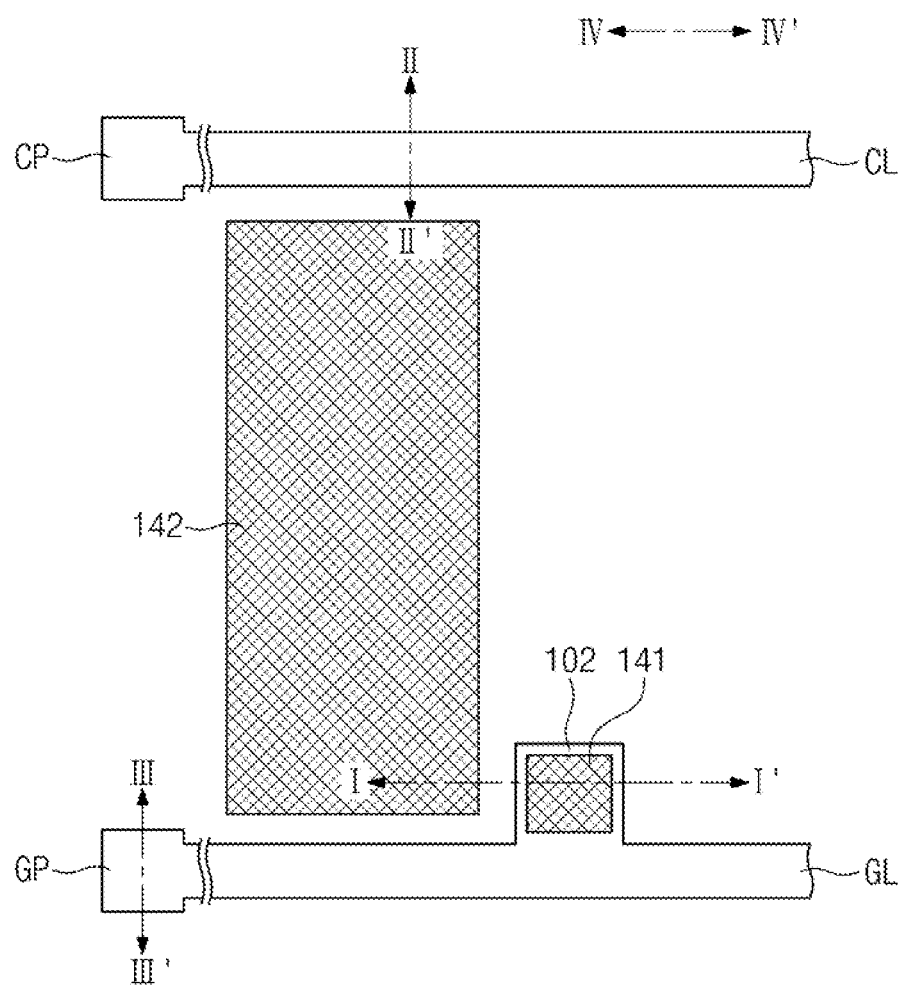
Figure 4B:
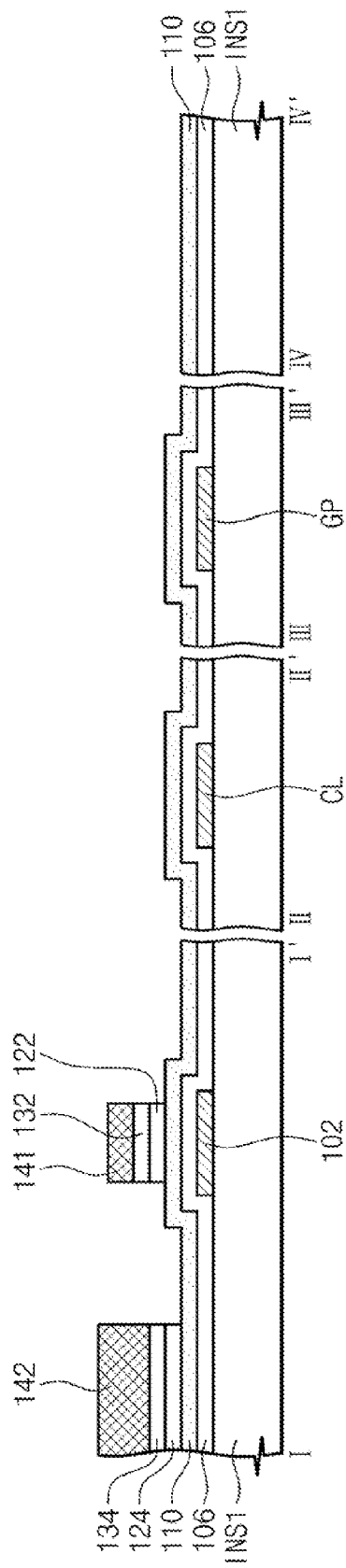

Referring to FIGS. 4A and 4B, a second photolithography process is performed to form a first mask pattern 141 and a second mask pattern 142 on the pixel electrode layer 130. The first mask pattern 141 is formed on the pixel electrode layer 130 to overlap the gate electrode 102. The second mask pattern 142 is spaced apart from the first mask pattern 141 and the gate electrode 102 when viewed in a plan view. The first mask pattern 141 may have a smaller area than the second mask pattern 142 in a plan view. The first and second mask patterns 141 and 142 may include a photoresist material.

The first mask pattern 141 has a first thickness and the second mask pattern 142 has a second thickness greater than the first thickness. To form the first and second mask patterns 141, 142, a mask layer is formed on the pixel electrode layer 130. Then, a portion of the mask layer, from which the first mask pattern 141 is formed, is half-tone slit-exposed, and a portion of the mask layer, from which the second mask pattern 142 is formed, is not exposed. Subsequently, when the mask layer is developed, the first and second mask patterns 141 and 142 are formed.

In a present exemplary embodiment, a positive type photoresist material, in which any area exposed to light is removed by a development process, is used to form the first and second mask patterns 141 and 142, but other embodiments are not be limited to a positive type photoresist material. That is, a negative type photoresist material, in which any area not exposed to light is removed by the development process, may also be used to form the first and second mask patterns 141 and 142.

The pixel electrode layer 130 is etched using the first and second mask patterns 141 and 142 as etching masks. After the pixel electrode layer 130 is etched, the insulating layer 120 is etched using the first and second mask patterns 141 and 142 as etching masks. The pixel electrode 130 may be wet-etched and the insulating layer 120 may be dry-etched. The oxide semiconductor layer 110 is not etched while the pixel electrode layer 130 and the insulating layer 120 are being etched.

Those portions of the pixel electrode layer 130 exposed and not covered by the first and second mask patterns 141 and 142 are etched to form a dummy electrode pattern 132 and the pixel electrode pattern 134. The dummy electrode pattern 132 is disposed between the first mask pattern 141 and the gate electrode 102. The pixel electrode pattern 134 is spaced apart from the dummy electrode pattern 132 and disposed between the second mask pattern 142 and the oxide semiconductor layer 110.

Those portions of the insulating layer 120 exposed and not covered by the first and second mask patterns 141 and 142 are etched to form the first insulating pattern 122 and the second insulating pattern 124. The first insulating pattern 122 is formed between the first mask pattern 141 and the gate electrode 102. The second insulating pattern 124 is formed between the oxide semiconductor layer 110 and the second mask pattern 142.

The first insulating pattern 122 and the dummy electrode pattern 132 on the first insulating pattern 122 are formed using the first mask pattern 141 as an etching mask. Thus, the sidewall of the first insulating pattern 122 may be aligned and coplanar with the sidewall of the dummy electrode pattern 132.

The second insulating pattern 124 and the pixel electrode pattern 134 on the second insulating pattern 124 are foamed using the second mask pattern 142 as an etching mask. Accordingly, the sidewall of the second insulating pattern 124 may be aligned and coplanar with the sidewall of the pixel electrode pattern 134.

When the pixel electrode layer 130 and the insulating layer 120 are etched, two different portions of the oxide semiconductor layer 110 are exposed. A first portion of the oxide semiconductor layer 110 is disposed adjacent to one side of the gate electrode 102 between the first insulating pattern 122 and the second insulating pattern 124. A second portion of the oxide semiconductor layer 110 is disposed adjacent to the other side of the gate electrode 102.

Figure 5A:
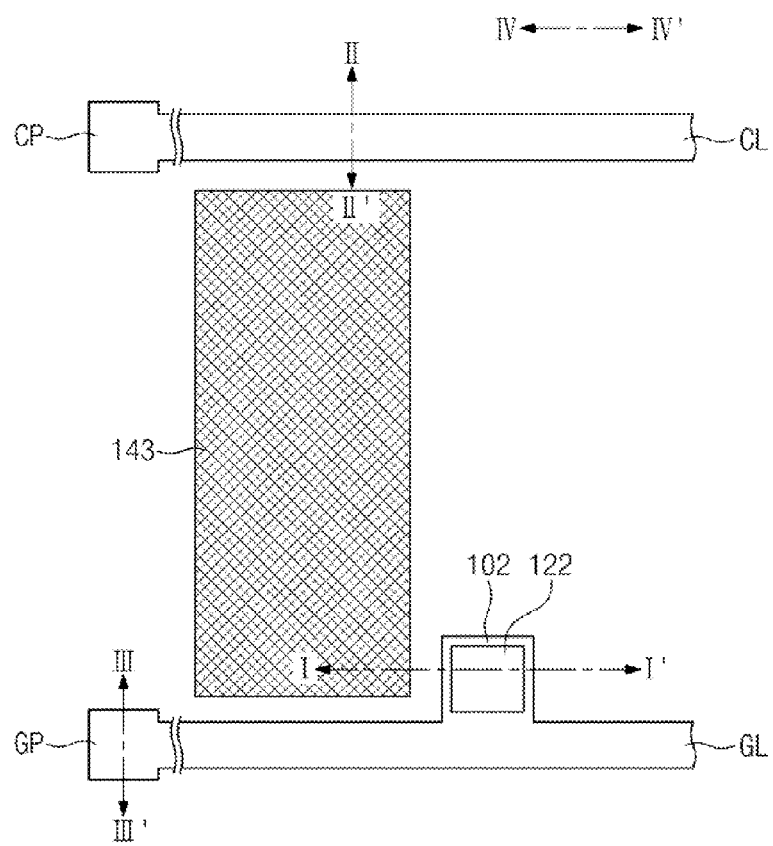

Referring to FIGS. 5A and 5B, portions of the first and second mask patterns 141 and 142 are removed to form a third mask pattern 143. For example, an upper portion of the second mask pattern 142 is removed leaving behind a lower portion of the second mask pattern 142. That is, the lower portion of the second mask pattern 142 serves as a third mask pattern 143. The third mask pattern 143 has a third thickness less than the second thickness. The first mask pattern 141 and the upper portion of the second mask pattern 142 may be removed by an ashing process and/or an etch back process. The first mask pattern 141, being thinner than the second mask pattern 142, is completely removed while the upper portion of the second mask pattern 142 is removed by the ash process and/or the etch back process.

When the first mask pattern 141 is removed, the dummy electrode pattern 132 is exposed. The dummy electrode pattern 132 is removed using the third mask pattern 143 as an etching mask, as described below, exposing the first insulating pattern 122. The pixel electrode pattern 134 is not removed as it is covered by the third mask pattern 143.

The channel area CA is defined where the oxide semiconductor layer 110 overlaps the gate electrode 102. When the turn-on voltage is applied to the gate electrode 102, a channel is formed in the channel area. The first insulating pattern 122 is disposed on the channel area of the oxide semiconductor layer 110 to protect the channel area from the following processes applied to remove the dummy electrode pattern 132.

Figure 6A:
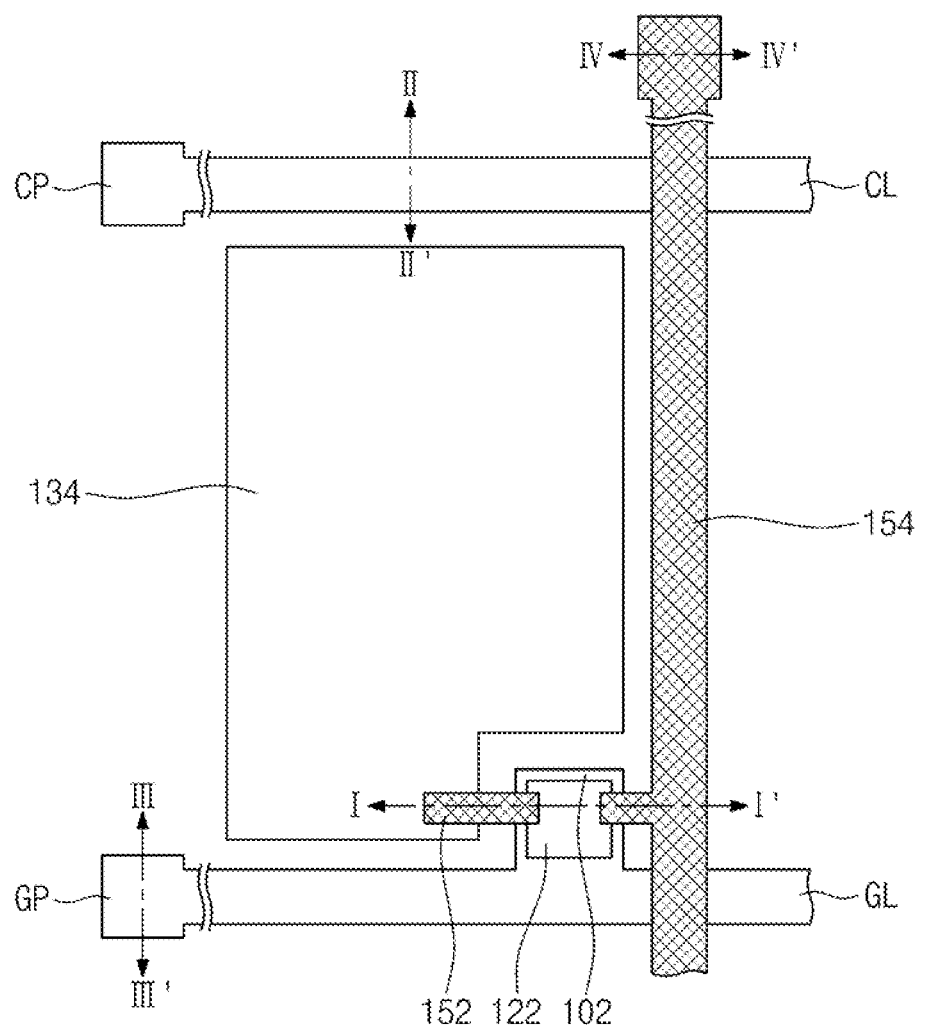
Figure 6B:
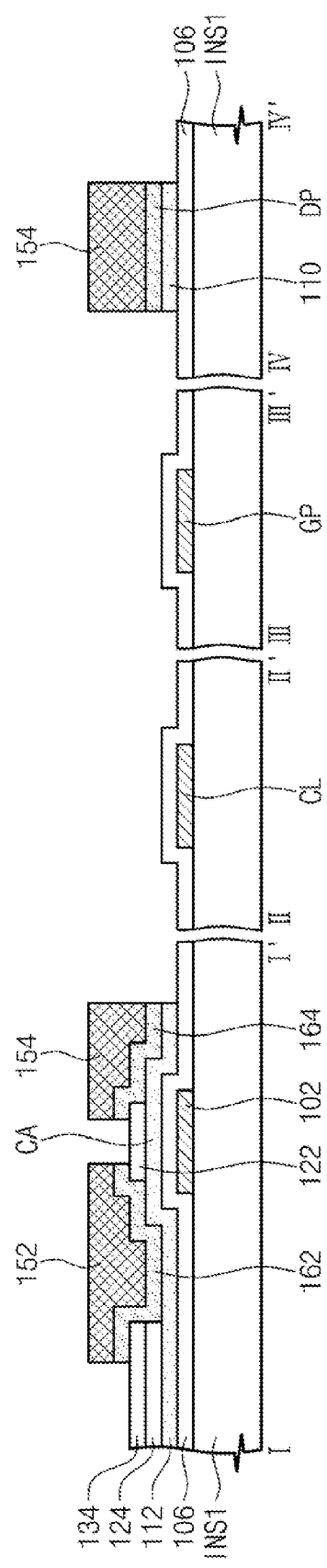

Referring to FIGS. 6A and 6B, a third photolithography process is performed, that forms the drain electrode 162, the source electrode 164, and the data line DL covering the first and second portions of the oxide semiconductor layer 110. The process applied to form the drain electrode 162 and the source electrode 164 includes forming a second conductive layer (not shown) on the first insulating substrate INS1, forming fourth mask patterns 152 and 154 on the second conductive layer, and etching the second conductive layer using the fourth mask patterns 152 and 154 as etching masks to form the drain electrode 162, the source electrode 164, and the data line DL. The fourth mask patterns 152 and 154 include a first segment 152 and a second segment 154. The first segment 152 covers the first portion of the oxide semiconductor layer 110. The second segment 154 covers the second portion of the oxide semiconductor layer 110 and extends in the second direction.

The source electrode 164 is branched from the data line DL. The data line DL includes the data pad part DP formed in an area corresponding to an end of the data line DL.

One end of the drain electrode 162 and one end of the source electrode 164 are spaced apart from each other and disposed on the first insulating pattern 122. The upper surface of the first insulating pattern 122 is disposed between the drain electrode 162 and the source electrode 164. The other end of the drain electrode 162 is disposed on the pixel electrode pattern 134.

The exposed oxide semiconductor layer 110 and the second conductive layer are removed using the fourth mask patterns 152 and 154 as the etching mask, thereby forming the oxide semiconductor pattern 112. Accordingly, the sidewall of the other end of the source electrode 164 is aligned and coplanar with the sidewall of the oxide semiconductor pattern 112 adjacent to the sidewall of the source electrode 164. In addition, the sidewall of the data pad part DP and/or the data line DL is aligned with the sidewall of the oxide semiconductor pattern 112. Thus, the sidewall of the data pad part DP and/or the data line DL is coplanar with the sidewall of the oxide semiconductor pattern 112.

Alternatively, the fourth mask patterns 152 and 154 may be removed after being used as etching masks for etching the second conductive layer. In this case, the oxide semiconductor layer 110 is etched using the drain electrode 162 and the source electrode 164, formed by etching the second conductive layer, as the etching mask, to thereby form the oxide semiconductor pattern 112.

Figure 7A:
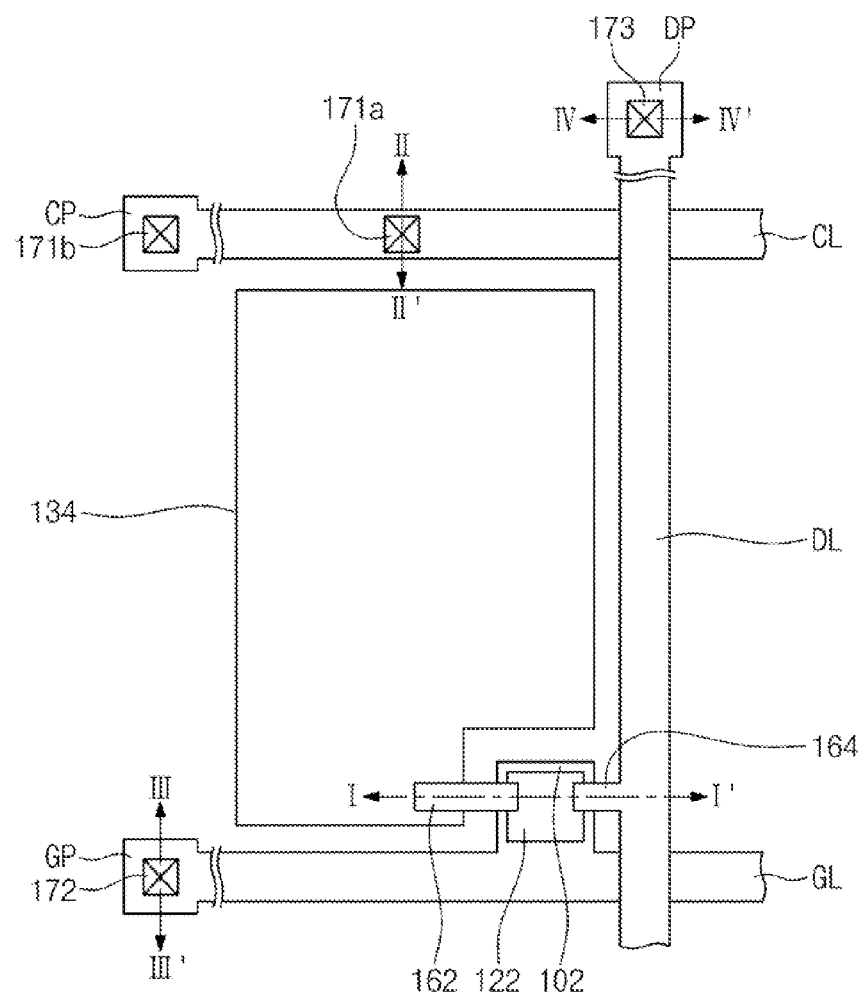

Referring to FIGS. 7A and 7B, the fourth mask patterns 152 and 154 are removed in a fourth photolithography process. The fourth mask patterns 152 and 154 may be removed by an ashing process and/or an etch back process. The interlayer dielectric layer 170 is formed to cover the drain electrode 162, the source electrode 164, and the data line DL.

Subsequently, the first common contact hole 171a is formed penetrating the interlayer dielectric layer 170 and the gate dielectric layer 106 to expose a portion of the common voltage line CL, the second common contact hole 171b is formed penetrating the interlayer dielectric layer 170 and the gate dielectric layer 106 to expose an upper surface of the common pad part CP, the gate contact hole 172 is formed penetrating the interlayer dielectric layer 170 and the gate dielectric layer 106 to expose the gate pad part GP, and the data contact hole 173 is formed penetrating the interlayer dielectric layer 170 to expose the data pad part DP.

A fifth photolithography process is performed to complete the manufacturing of the first substrate SUB1. To this end, a transparent conductive layer is formed on the interlayer dielectric layer 170 and is patterned to form the common electrode 180. The common electrode 180 makes contact with the exposed portion of the common voltage line CL in the first common contact hole 171A. The common electrode 180 includes the body portion 182 and the branch portions 184 branched from the body portion 182. The transparent conductive layer may include the same material as the pixel electrode pattern 134.

The first substrate SUB1 manufactured by the above-mentioned method is disposed to face the second substrate SUB2 on which the color filters are formed, and the liquid crystal layer LC is disposed between the first substrate SUB1 and the second substrate SUB2, thereby completing the display apparatus.

As described above, a display apparatus according to exemplary embodiments of the present disclosure is operated in the PLS mode. In addition, the display apparatus uses oxide semiconductor patterns 112 having a high carrier mobility in the channel of the thin film transistor. The first substrate SUB1 of the display apparatus is manufactured by five photolithography processes, reducing the number of processes required to manufacture the display apparatus. Thus, the manufacturing cost of the PLS mode display apparatus may be reduced and the corresponding manufacturing process may be simplified.

Although the exemplary embodiments of the present disclosure have been described, it is understood that embodiments of the present disclosure should not be limited to these exemplary embodiments but various changes and modifications can be made by one of ordinary skill in the art within the spirit and scope of the present disclosure as hereinafter claimed.

What is claimed is:

1. A display apparatus comprising: a substrate; and
a plurality of pixels disposed on the substrate, each pixel comprising: a gate electrode disposed on the substrate; a gate dielectric layer disposed on the substrate and the gate electrode;
an oxide semiconductor pattern that overlaps the gate electrode disposed on the gate dielectric layer;
a first insulating pattern disposed directly, on the oxide semiconductor pattern that overlaps the gate electrode;
a second insulating pattern disposed directly on the oxide semiconductor pattern and spaced apart from the first insulating pattern;
a drain electrode disposed on the oxide semiconductor pattern;
a source electrode disposed on the oxide semiconductor pattern and spaced apart from the drain electrode; and
a pixel electrode pattern disposed on the second insulating pattern that contacts the drain electrode, wherein
the drain electrode covers a portion of the pixel electrode pattern and the oxide semiconductor pattern between the first and second insulating patterns, the second insulating pattern is spaced apart from the gate electrode, and a sidewall of the second insulating pattern is aligned and coplanar with a sidewall of the pixel electrode pattern.

2. The display apparatus of claim 1, wherein the drain electrode covers a portion of the pixel electrode pattern.

3. The display apparatus of claim 1, wherein a sidewall of the second insulating pattern is aligned and coplanar with a sidewall of the pixel electrode pattern.

4. The display apparatus of claim 1, wherein the second insulating pattern is spaced apart from the gate electrode.

5. The display apparatus of claim 1, further comprising:
a plurality of gate lines that extend in a first direction;
a plurality of data lines that extend in a second direction crossing the first direction and disposed on the oxide semiconductor pattern, wherein the gate electrode protrudes from the gate line and the source electrode protrudes from the data line.

6. The display apparatus of claim 1, wherein the drain electrode covers the oxide semiconductor pattern between the first and second insulating patterns.

7. The display apparatus of claim 1, further comprising
a common electrode disposed over the pixel electrode pattern that form an electric field with the pixel electrode pattern.

8. The display apparatus of claim 7, wherein a channel area is defined where the oxide semiconductor pattern overlaps the gate electrode, wherein a channel is formed in the channel area when a turn-on voltage is applied to the gate electrode, said channel having a higher carrier mobility than a channel formed in a silicon layer.

9. The display apparatus of claim 1, wherein the pixel electrode pattern has substantially a same area as that of the second insulating pattern.

10. The display apparatus of claim 7, wherein the common electrode comprises a body portion and a plurality of branch portions branched from the body portion.

* * * * *